July 24, 1962 S. L. MATLOW 3,046,324

ALLOYED PHOTOVOLTAIC CELL AND METHOD OF MAKING THE SAME

Filed Jan. 16, 1961

INVENTOR.
SHELDON L. MATLOW
BY M. Jabin
ATTORNEY

United States Patent Office 3,046,324
Patented July 24, 1962

3,046,324

ALLOYED PHOTOVOLTAIC CELL AND METHOD OF MAKING THE SAME

Sheldon L. Matlow, Arcadia, Calif., assignor to Hoffman Electronics Corporation, a corporation of California Filed Jan. 16, 1961, Ser. No. 82,801
12 Claims. (Cl. 136—89)

The present invention relates to semiconductor photovoltaic cells, and more particularly to photovoltaic cells having an alloyed p-n junction and to the method of making the alloyed junction.

Photovoltaic or solar cells having diffused p-n junctions are well known in the art, but no satisfactory solar cell having an alloyed p-n junction is available. One of the serious problems presented by diffused junction solar cells is the difficulty in controlling the depth of the p-n junction, the depth being a very critical factor in the performance of solar cells. Control of the depth is very desirable.

It is an object of the present invention, therefore, to provide a novel solar cell.

It is another object to provide a solar cell having an alloyed p-n junction.

It is a further object of the present invention to provide a method for making a solar cell having an alloyed p-n junction and controlling the depth of the junction.

According to the present invention, a solar cell having an alloyed p-n junction is made by depositing a metal such as aluminum upon a silicon wafer, alloying the metal to the silicon, and etching off the metal in the central region of the wafer.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings, in which:

Figures 1, 2, 3, 4:
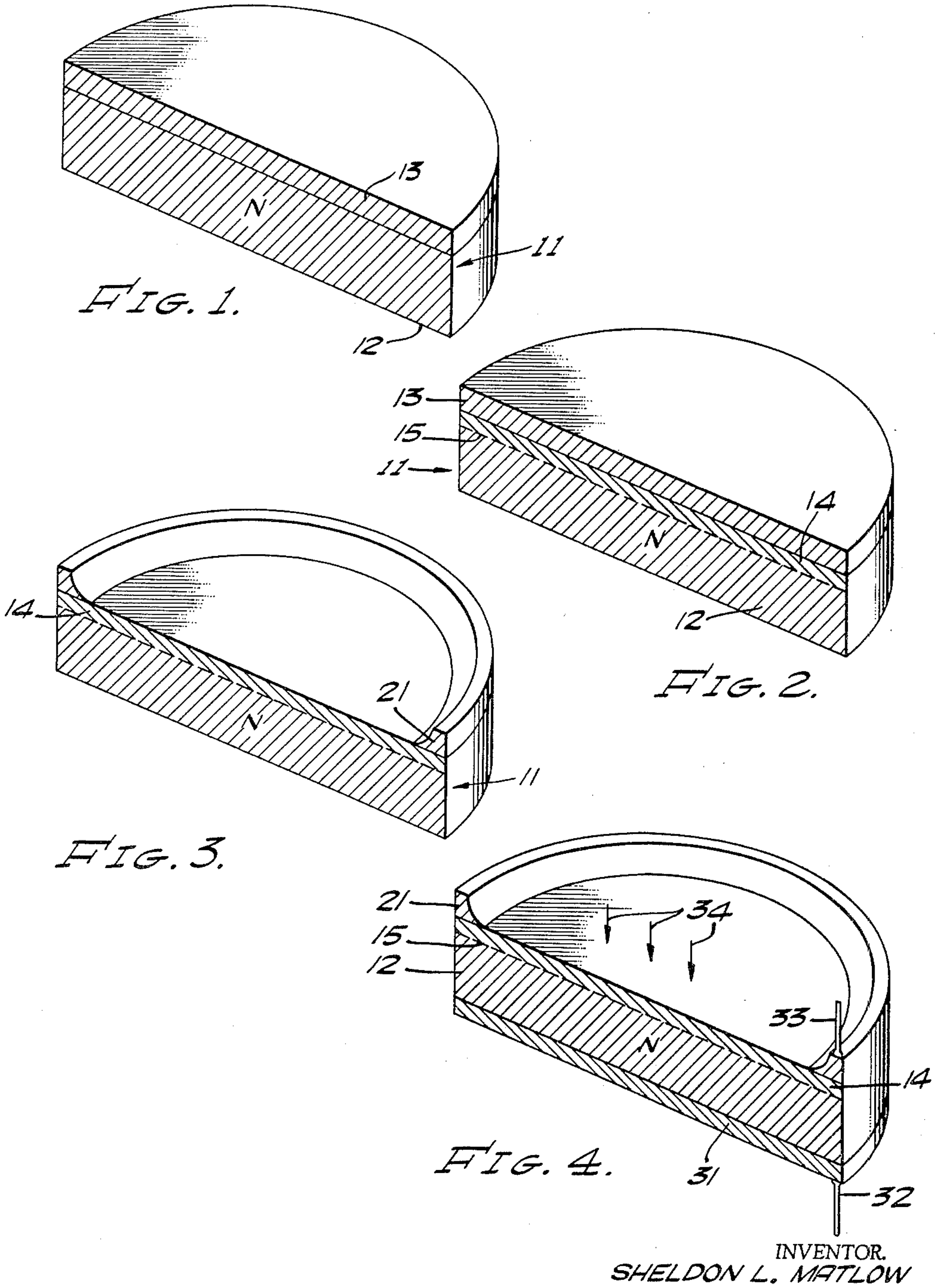
FIGURE 1 is a sectional view of a silicon wafer.
FIGURE 2 is a sectional view of a silicon wafer having an alloyed p-n junction.
FIGURE 3 is a sectional view of a solar cell made according to the present invention.
FIGURE 4 is a sectional side view of the device shown in FIGURE 3 after electrical leads have been added to it.

Referring now to the drawings, FIGURE 1 shows silicon wafer 11 having n-type conductivity region 12, which can be obtained by doping pure silicon with phosphorus. Wafer 11 has a diameter of approximately one inch and is approximately 10–15 mils thick. Aluminum layer 13 can be evaporated upon silicon wafer 11 and is approximately 1–3 microns thick. Alternative procedures would be to evaporate an aluminum-boron alloy upon wafer 11, or to use a preform of aluminum or an aluminum alloy. Other combinations involving gallium and indium could also be used. After the evaporation or application of the preform the device is heated and aluminum layer 13 is alloyed to silicon wafer 11.

FIGURE 2 shows silicon wafer 11 after the alloying step. N-type conductivity region 12 is separated from p-type conductivity region 14 by p-n junction 15. The thickness of p-type region 14 and, hence, the depth of p-n junction 15 are controllable functions of the alloying temperature and the amount of aluminum present during alloying. If 3 microns of aluminum should be heated to a temperature of 750 degrees centigrade, p-type region 14 will be about 1 micron thick. Thus, it is possible to obtain carefully determined junction depths by means of the alloying procedure. The device shown in FIGURE 2, however, is not suitable in that stage for use as a solar cell, because of the opacity of aluminum layer 13.

The wafer can be adapted for use as a solar cell by masking off the region around the edge of the device on the aluminum side. The aluminum is then etched off the central region of the wafer with an acid such as hydrochloric acid. It should be noted that other geometric configurations can be used for the masking of the aluminum. The ring geometry is described here only by way of an example.

FIGURE 3 shows how wafer 11 looks after the etching step. The aluminum layer is ring-shaped so as to expose the major portion of p-type region 14 to incident solar energy through the center of the ring. In the configuration shown, the inner diameter of aluminum ring 21 is approximately three-fourths of an inch. An operable solar cell with be obtained upon providing the device with an ohmic contact and electrical leads.

The solar cell is prepared for electrical leads by masking the entire aluminum and p-side. To obtain an ohmic contact, a metal such as gold is chemically plated onto the silicon side that is opposite the aluminum side. If desired, the gold can be evaporated upon the silicon. The gold on the n-side is then masked, and the p-n- junction is etched with aqua regio, followed by a brief hydrofluoricnitric acid etch. Electrical leads are then soldered to the aluminum and gold portions.

FIGURE 4 shows the finished solar cell. Gold ohmic contacts 31 has been deposited upon n-type region 12, and copper lead 32 has been soldered to ohmic contact 31. Lead 33 has been soldered to aluminum ring 21. Thus, solar energy, represented by arrows 34, can fall relatively unobstructed upon p-type region 14, while electrical contact to p-type region 14 is made through aluminum ring 21, and to n-type region 12 through ohmic contact 31. The depth of p-n junction 15 is determined during the alloying of the aluminum layer to the wafer.

While particular embodiments of the present invention have been shown and described, it will be obvous to those skilled in the art that changes and modifications may be made without departing from this invention in its broader aspects, and, therefore, the aim in the appended claims is to cover all such changes and modifications as fall within the true spirit and scope of this invention.

I claim:

1. A method of making a solar cell, comprising the steps of: depositing an aluminum layer upon an n-type silicon wafer; alloying said aluminum layer to said wafer so as to form within said wafer n- and p-type regions separated by a p-n junction; masking a ring-like configuration of said aluminum layer; and etching away all of the unmasked portion of said aluminum layer, thereby exposing said p-type region in the central portion of said wafer through said ring-like configuration.

2. A method as defined in claim 1 including, in addition, the steps of masking said ring-like configuration and said p-n junction; chemically depositing a gold layer upon said n-type region to make an ohmic contact thereto, and soldering first and second electrical leads to said aluminum and gold layers, respectively.

3. A method of making a solar cell, comprising the steps of: depositing a metal layer upon an n-type silicon wafer; alloying said metal layer to said wafer so as to form within said wafer n- and p-type regions separated by a p-n junction; and etching away said metal layer from the central region of said wafer so as to cause said metal layer to be ring shaped, thereby exposing said p-type region through said ring-shaped metal layer.

4. A method of making a photovoltaic cell, comprising the steps of: depositing a metal layer upon a semiconductor having first-type conductivity; heating said layer and semiconductor until an alloyed p-n junction is formed within said semiconductor so as to separate said semiconductor into first and second-type conductivity regions separated by a p-n junction; and removing said metal layer from a major portion of said semiconductor so as to expose said second-type conductivity region.

5. A method of making a solar cell, comprising the steps of: alloying a metal layer to a semiconductor having first-type conductivity so as to form within said semiconductor first and second-type conductivity regions separated by a p-n junction; and removing said metal layer from the central region of said semiconductor so as to cause said metal layer to be ring shaped, thereby exposing said second-type conductivity region through said ring-shaped metal layer.

6. A method of making a photovoltaic cell, comprising the steps of: alloying a metal layer to a semiconductor having first-type conductivity so as to form within said semiconductor first and second-type conductivity regions separated by a p-n junction; and removing said metal layer from a major portion of one surface of said semiconductor so as to expose said second-type conductivity region.

7. A method as defined in claim 6 including, in addition, the steps of making first and second ohmic contacts to said metal layer and to said second-type conductivity region, respectively.

8. A method of making a p-n junction photovoltaic cell comprising the steps of:

(*a*) providing a relatively thick flat substrate of a semiconductor having a first conductivity type, (*b*) applying to one of the flat surfaces of said substrate a relatively thinner opaque layer of a metal capable of alloying with said semiconductor and thereby converting the alloyed region thereof to a second conductivity type, (*c*) heating at least the interfacial region between said substrate and said layer to produce an interfacial p-n alloyed junction region of controlled depth therebetween, (*d*) thereafter removing substantial area portions, but less than all, of the unalloyed metal constituting said opaque layer to expose said junction region throughout a major portion of its area for light impingement on said junction region, and (*e*) providing ohmic terminal contacts to the other flat surface of said substrate and to the residual area portions of said layer.

9. The method in accordance with claim 8, in which said substrate is silicon.

10. The method in accordance with claim 9, in which the metal of said opaque layer is aluminum.

11. The method in accordance with claim 8, in which the removing of portions of the unalloyed metal of said opaque layer is accomplished by etching.

12. The method in accordance with claim 8, in which the removal of said area portions of said unalloyed metal layer is accomplished in a central region only of said layer, leaving a residual margin of said layer in contact with said p-n junction region.

References Cited in the file of this patent

UNITED STATES PATENTS

| | | |
|---|---|---|
| 2,794,846 | Fuller | June 4, 1957 |
| 2,846,346 | Bradley | Aug. 5, 1958 |
| 2,919,299 | Paradise | Dec. 29, 1959 |
| 2,929,859 | Loferski | Mar. 22, 1960 |

UNITED STATES PATENT OFFICE
CERTIFICATE OF CORRECTION

Patent No. 3,046,324

July 24, 1962

Sheldon L. Matlow

It is hereby certified that error appears in the above numbered patent requiring correction and that the said Letters Patent should read as corrected below.

Column 2, line 15, for "with" read -- will --; line 27, for "contacts" read -- contact --; line 37, for "obvous" read -- obvious --.

Signed and sealed this 11th day of December 1962.

(SEAL)
Attest:

ERNEST W. SWIDER
Attesting Officer

DAVID L. LADD
Commissioner of Patents